United States Patent [19]

Tisone et al.

[11] 4,221,649

[45] Sep. 9, 1980

[54] THIN FILM STRAIN GAGE AND PROCESS THEREFOR

[75] Inventors: Thomas C. Tisone, Thousand Oaks; Barry F. T. Bolker, Oxnard, both of Calif.

[73] Assignee: Gould Inc., Rolling Meadows, Ill.

[21] Appl. No.: 28,150

[22] Filed: Apr. 9, 1979

Related U.S. Application Data

[62] Division of Ser. No. 937,413, Aug. 28, 1978.

[51] Int. Cl.² ............................................. C23C 15/00
[52] U.S. Cl. ................................................ 204/192 D
[58] Field of Search ...................... 204/192 D, 192 F; 427/58; 338/2

[56] References Cited

U.S. PATENT DOCUMENTS 4,104,605  8/1978  Boudreaux et al. ..................... 338/2

*Primary Examiner*—John H. Mack
*Attorney, Agent, or Firm*—Charles E. Snee, III; Russell E. Baumann; Edward E. Sachs

[57] ABSTRACT

A thin film strain gage is deposited on a flexure beam under controlled deposition conditions such that the dielectric parts thereof are normally in a compressive state. During use, when the strain gage is flexed in a manner tending to place parts thereof in tension, the dielectric parts are instead maintained either in compression, which is their more resistant state against mechanical fracture, or only in slight tension. Specifically, the dielectric films are deposited by sputtering with the substrate negatively biased, with the deposition rate and substrate temperature maintained at predetermined levels for enhancing compressive deposition.

5 Claims, 2 Drawing Figures

THIN FILM STRAIN GAGE AND PROCESS THEREFOR

This is a division of application Ser. No. 937,413, filed Aug. 28, 1978.

The present invention relates generally to thin film strain gages, and, more particularly, to such strain gages having improved resistance against deterioration or breakdown from stressing.

BACKGROUND OF THE INVENTION

One type of so-called strain gage includes a flexure beam with a plurality of thin film resistors deposited thereon, interconnected in a Wheatstone bridge arrangement. Forces to be measured are applied to the flexure beam which induces a corresponding strain in the bridge resistors, placing certain resistors in compression and other in tension. The degree of strain in the resistors can be determined electrically, which thereby provides a measure of the force exerted on the beam.

In use, the strain gage is subjected to continual flexing, which, in the past, has been found to result in failure or reduced performance primarily through breakdown of the insulation dielectric. That is, the bridge resistors are separated from the metal flexure beam by a dielectric film or layer to provide electrical integrity for the bridge and associated circuits. The insulation dielectric film is constructed of materials (e.g., SiO, SiO$_2$) which are especially liable to break down physically and electrically, and such breakdown will either substantially impair operation of the gage or render it totally inoperable.

SUMMARY OF THE INVENTION

In the practice of the process of this invention, a thin film strain gage is deposited on a flexure beam under controlled conditions such that the dielectric parts thereof are normally in a compressive state. In this way, when the strain gage is flexed in a manner tending to place parts thereof in tension, the dielectric parts are instead maintained in compression, which is their most resistant state against mechanical fracture.

Specifically, the dielectric films are deposited by sputtering with the substrate negatively biased. Also, the deposition rate and substrate temperature are maintained at predetermined levels for enhancing compressive deposition.

DESCRIPTION OF A PREFERRED EMBODIMENT

Figure 1:
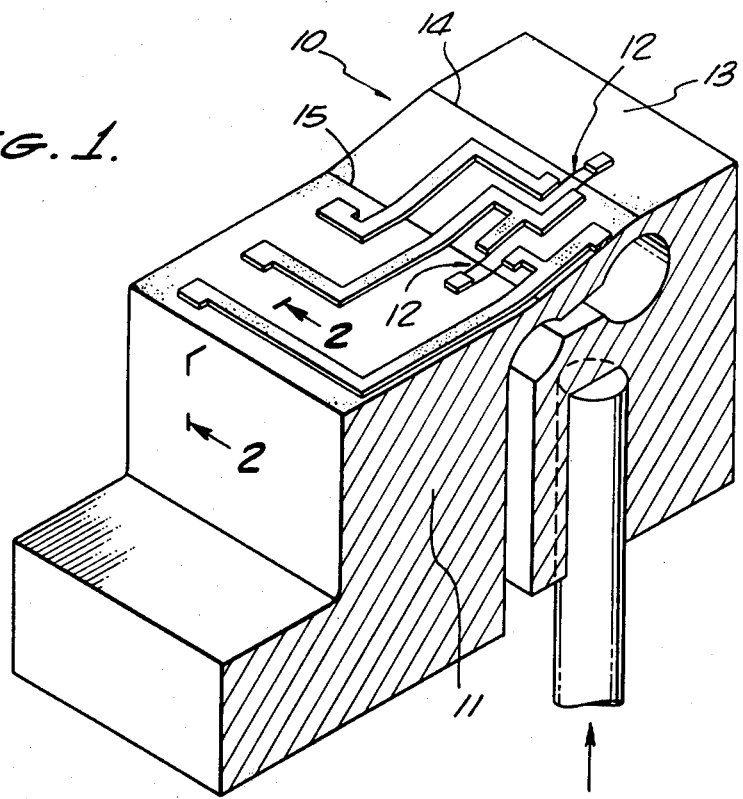
FIG. 1 is a perspective view of a strain gage transducer.

Turning now to the drawing and particularly FIG. 1, a strain gage transducer is enumerated generally as at 10, and is seen to include a flexure beam 11 and a thin film resistance bridge 12 deposited on the moving or active surface 13 of the beam with the remaining patterns forming electrical interconnections. The beam is so constructed that deflecting movements (i.e., forces) applied to the beam in the direction of the arrow deforms the active surface 13 from the flat (unstressed) condition to the S-shaped curve depicted. With the beam curved in this manner, one part of the resistance bridge is placed in tension 14, while another part 15 is simultaneously in compression. This straining of the strain gage resistances produces corresponding changes in the various resistance values that are rendered by collateral electrical/electronic circuit apparatus to provide the desired electrical measurement of the unknown force.

Figure 2:
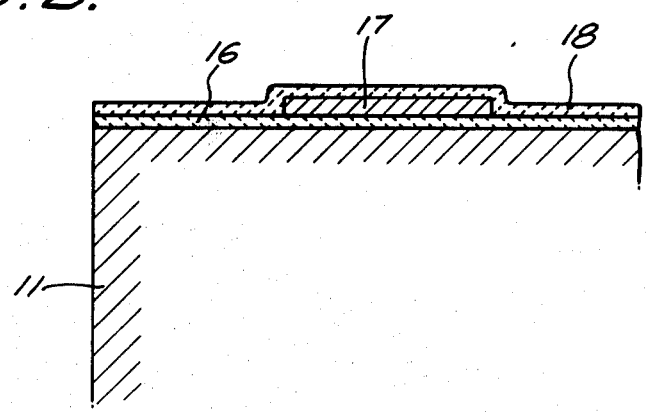
FIG. 2 is a sectional, elevational view, taken along the line 2—2 of FIG. 1.

With reference also to FIG. 2, it is seen that an insulation thin film 16 of a good dielectric material such as silicon monoxide or silicon dioxide, for example, is first laid down on the active or moving surface 13 of the beam. Next, the various bridge resistances and interconnections 17 forming a Wheatstone bridge, for example, are deposited onto the insulation film 16. Finally the bridge is covered with a so-called passivation thin film 18 which is also constructed of a good dielectric and can be of the same material as that composing film 16.

The use of an insulation film 16 in connection with a deposited resistance bridge to form a strain gage transducer is known. However, in the past, the dielectric films were either deposited in an initial state of tension or in an uncontrolled state of stress, resulting in substantial film tension upon flexing of the beam during use. Dielectric materials are well known to be susceptible to stress corrosion failure when in tension. Upon developing cracks, the bridge may then electrically short to the beam or perhaps become physically loosened so that errors in measurements result. In the case of passivation films, if even very small cracks are produced, crack propagation has been found to be accelerated by the presence of foreign ions in aqueous solutions that may be supplied by an adverse environment. It is, therefore, critical to the achievement of long life and reliable performance of a deposited insulation film and passivation film that they be maintained free of cracks. Moreover, it is basic to this invention that exceptional resistance to crack development is achieved by depositing dielectric films in such a manner that they will reside initially in sufficient compression such that when subjected to tensile straining by the beam, they will remain in compression or in very moderate tension throughout the usual range of operation and expected overloads.

An especially important benefit from the compressive state of stress in the insulation dielectric is the improvement of overload protection of the sensor. A frequently encountered mode of failure of a strain gage in the past has been the cracking of the insulation dielectric film in the tension side of the beam. By providing a compressive stress in the insulation dielectric, the stress level in the metal beam or pressure overload protection of the strain gage transducers is increased. Experimental results have shown that as high as a factor of 2 improvement in overload protection for insulation films can be obtained by depositing the film with a compressive stress in the range of $1-9 \times 10^9$ dynes/cm$^2$.

It has been found that deposited film stress is functionally related to several deposition variables, namely, electrical bias of the substrate, deposition rate, substrate temperature, and the partial pressure of a reactive gas in the event of reactive sputtering. The copending U.S. patent application, DEPOSITION PROCESS MONITORING AND CONTROL SYSTEM by T. C. Tisone and T. Latos, Serial No. 908,808, now U.S. Pat. No. 4,172,020, discloses a system which enables control of the various deposition conditions in sputtering deposition, including those noted as affecting film stress, and would be an excellent means and process for use in achieving the prestressed films required to practice this invention.

It has been found that a deposited dielectric film (i.e. silicon monoxide or silicon chloride); will have an inherent (unflexed) compressive stress in the desired range of $1-9\times10^9$ dynes/cm$^2$ when the substrate temperature is maintained within the range of 200°–300° C., and preferably closer to 200° C. Moreover, the rate of film deposition influences the film stress, with the desired range of compressive stress ($1-9\times10^9$ dynes/cm$^2$) being best achieved when the deposition rate is between 30–100 Å/minute.

Still further, although the final film thickness has an effect on the stress condition, tests indicate that for successful deposition of a film in compression, the film thickness should be in the range of 0.5–5.0 micrometers.

However, for determining the essential compression state of a deposited film as contrasted with a state of tension, the most important deposition condition is maintaining the substrate biased electrically negative. For negative biasing of anywhere from $-50$ to $-200$ developed D.C., in a radio frequency sputtering operation, the deposited film is decidedly in compression (i.e., $1-9\times10^9$ dynes/cm$^2$).

It is also believed that direct negative D.C. biasing of the substrate on which a film is deposited should result in the film being laid down in compression. An additional benefit of negative bias sputtering is improved "step" coverage of the passivation dielectric film 18 over the underlying bridge circuit pattern. Geometry induced cracks or defects at surface steps can lead to corrosion or other physical changes in the resistor film 17 which are undersirable in strain gage application.

Accordingly, in the practice of this invention, while depositing the dielectric films by sputtering, the substrate is held at a negative rf bias throughout. Optionally, in rf sputtering, the substrate can be held at a negative D.C. bias. The magnitude of the compressive stress is also affected by proper control of both substrate temperature and deposition rate. The optimum stress level to ensure good film adhesion while obtaining a state of compressive stress is determined by maintaining all three factors within the ranges described herein while restricting overall film thickness to less than 5 micrometers.

What is claimed is:

1. A process for sputtering deposition of compressively stressed dielectric films in a thin film strain gage including a plurality of electrical resistances, comprising:

depositing a film of dielectric material at a rate of approximately 30 to 100 Å per minute on a substrate in which the substrate material temperature is under 300° C. while maintaining the substrate negatively biased; and depositing the electrical resistances on said dielectric film.

2. A process as set forth in claim 1 further providing for depositing a second film of dielectric material over said resistances.

3. A process as set forth in claim 1 further providing for depositing a second film of dielectric material over said resistances in the manner as set forth for depositing the film of claim 8.

4. In a process for making a strain gage comprising a flexure beam on which a dielectric film and thin film electrical resistances are deposited in which said flexure beam places at least a portion of said thin film resistances in tension, the improvement comprising the step of:

depositing by cathode sputtering said dielectric film on said beam said dielectric film being deposited with initial compression of such magnitude that after the tension is placed on the resistances, the dielectric film remains in predetermined safe range of compression and tension to resist mechanical fracture.

5. The process of claim 4 further providing for depositing a second dielectric film over said resistances, said second film being deposited with initial compression of such magnitude that after the tension is placed on the resistances the second film remains in predetermined safe range of compression and tension.

* * * * *